US006969872B2

(12) United States Patent
Kim

(10) Patent No.: US 6,969,872 B2
(45) Date of Patent: Nov. 29, 2005

(54) THIN FILM TRANSISTOR ARRAY PANEL FOR LIQUID CRYSTAL DISPLAY

(75) Inventor: Dong-Gyu Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/788,154

(22) Filed: Feb. 26, 2004

(65) Prior Publication Data

US 2004/0173797 A1   Sep. 9, 2004

Related U.S. Application Data

(63) Continuation of application No. 10/228,211, filed on Aug. 26, 2002, now Pat. No. 6,710,372.

(30) Foreign Application Priority Data

May 27, 2002   (KR) .............................. 2002-29290

(51) Int. Cl.[7] .......................................... H01L 31/0232
(52) U.S. Cl. ........................... 257/72; 257/59; 349/54; 349/192; 345/93
(58) Field of Search ...................... 257/72, 59; 349/54, 349/192; 345/93

(56) References Cited

U.S. PATENT DOCUMENTS

| | | | | |
|---|---|---|---|---|
| 5,648,826 A | * | 7/1997 | Song et al. .................... | 349/42 |
| 5,852,482 A | * | 12/1998 | Kim ............................. | 349/46 |
| 5,929,489 A | * | 7/1999 | Deane ......................... | 257/347 |
| 6,628,368 B2 | * | 9/2003 | Yang .......................... | 349/192 |
| 6,646,694 B2 | * | 11/2003 | Lee ............................. | 349/55 |
| 6,664,568 B2 | * | 12/2003 | Lai ............................. | 257/59 |
| 6,677,613 B1 | * | 1/2004 | Yamazaki et al. ............ | 257/72 |
| 6,855,957 B1 | * | 2/2005 | Yamazaki et al. ............ | 257/72 |

* cited by examiner

Primary Examiner—Tom Thomas
Assistant Examiner—Eugene Lee
(74) Attorney, Agent, or Firm—F. Chau & Associates, LLC

(57) ABSTRACT

There are provided two subpixels opposite each other with respect to each data line. A pair of gate lines are provided for each row of pixels. A plurality of subsidiary signal lines are provided between the adjoining columns of the pixels. The data lines and the subsidiary signal lines are alternately arranged between the adjoining columns of the pixels. A storage wire is provided between the adjoining rows of the pixels.

6 Claims, 27 Drawing Sheets

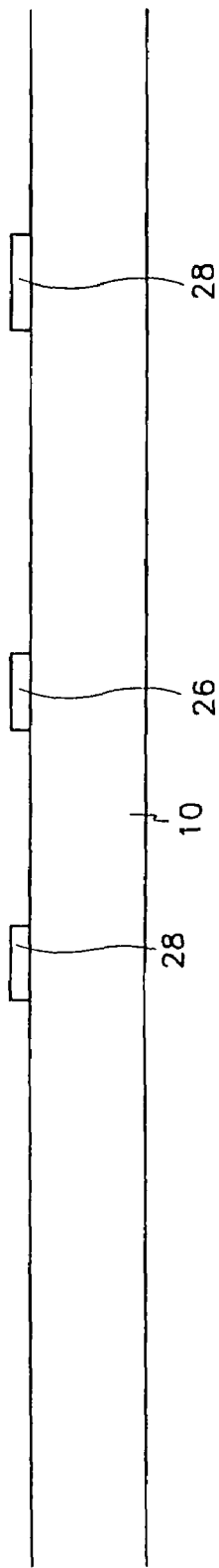

THIN FILM TRANSISTOR ARRAY PANEL FOR LIQUID CRYSTAL DISPLAY

This is a continuation application of U.S. application Ser. No. 10/228,211 filed Aug. 26, 2002 now U.S. Pat. No. 6,710,372.

BACKGROUND OF THE INVENTION (a) Field of the Invention

The present invention relates to a thin film transistor array panel for a liquid crystal display.

(b) Description of the Related Art

A liquid crystal display ("LCD") is one of the most commonly used flat panel displays. The LCD, which includes two panels having a plurality of electrodes thereon and a liquid crystal layer interposed therebetween, controls the transmittance of incident light by applying voltages to the electrodes to rearrange liquid crystal molecules of the liquid crystal layer.

Among these LCDs, a LCD having electrodes provided both on respective panels and a plurality of thin film transistors ("TFTs") for switching the voltages applied to the electrodes are typically used. The LCD has a plurality of pixel electrodes receiving image signals depending on the switching of the TFTs. In addition, the LCD has a plurality of gate lines respectively connected to output terminals of gate driving integrated circuits ("ICs") for supplying scanning signals to turn on and off the TFTs and a plurality of data lines respectively connected to output terminals of data driving ICs for supplying image signals.

The higher resolution of a LCD requires more gate lines and data lines and thus more driving ICs, thereby increasing manufacturing costs.

SUMMARY OF THE INVENTION

A thin film transistor panel is provided, which includes: a plurality of pairs of gate lines extending substantially in a horizontal direction and transmitting scanning signals, each pair of gate lines including a first gate line and a second gate line; a plurality of data lines transmitting images signals and extending substantially in a vertical direction; a plurality of pairs of thin film transistors, each transistor having a gate electrode, a source electrode and a drain electrode, each pair of thin film transistors corresponding to one pair of gate lines and one of the plurality of data lines and including a first thin film transistor and a second thin film transistor respectively connected to the first and the second gate lines of the corresponding pair of pixel electrodes and connected to the corresponding data line; and a plurality of pairs of pixel electrodes arranged in a matrix with a plurality of rows and a plurality of columns, each pair of pixel electrodes corresponding to one pair of thin film transistors and including a first pixel electrode and a second pixel electrode adjacent to each other and respectively connected to the first and the second thin film transistors of the corresponding pair of thin film transistors, the plurality of data lines arranged such that each of the plurality of data lines is located between adjacent two columns and assigned every two columns.

According to an embodiment of the present invention, the thin film transistor array panel further includes a plurality of subsidiary signal lines extending substantially in the vertical direction, and the plurality of data lines and the plurality of subsidiary signal lines are alternately arranged between adjacent two columns and overlap the plurality of pixel electrodes at least in part.

According to an embodiment of the present invention, the thin film transistor array panel further includes a storage wire overlapping the plurality of pixel electrodes to form storage capacitors. The storage wire includes a plurality of storage electrode lines extending substantially in the horizontal direction and a plurality of storage electrodes connected to the plurality of storage electrodes, each storage electrode overlapping the drain electrode. The plurality of storage electrodes extend substantially in the vertical direction, are arranged between the plurality of pixel electrodes and overlap an edge of the plurality of pixel electrodes at least in part.

According to an embodiment of the present invention, the thin film transistor array panel further includes a passivation layer interposed between the plurality of pixel electrodes and the drain electrodes and having a plurality of contacts for connecting the plurality of pixel electrodes to the drain electrodes. Preferably, the passivation layer has an uneven surface and includes a photoresistive organic material.

According to an embodiment of the present invention, the first and the second gate lines of each pair of gate lines are located at top and bottom of the corresponding pair of pixels. Each data line is arranged between the first and the second pixel electrodes of the corresponding pair of the pixel electrodes.

According to another embodiment of the present invention, each of the plurality of data lines has a dual-lined structure including a first signal line, a second signal line and a connection interconnecting the first and the second signal lines.

According to another embodiment of the present invention, the first and the second thin film transistor have rotational symmetry to each other.

According to an embodiment of the present invention, the plurality of pixel electrodes include Al, Al alloy, Ag or Ag alloy. Each pixel electrode includes a transparent conductive layer comprising ITO or IZO and an opaque conductive layer and the opaque conductive layer has an aperture portion exposing 20–30 percent of the area of the opaque conductive layer.

A method of manufacturing a thin film transistor panel is provided, which includes: forming a gate wire including first and second gate lines and first and second gate electrodes connected to the first and the second gate lines, respectively; forming a gate insulating layer covering the gate wire; forming a semiconductor layer on the gate insulating layer; forming a data wire on the semiconductor layer, the data wire including first and second data lines, first and second source electrodes connected to the first and the second data line, first and second drain electrodes respectively separated from the first and second source electrodes and data connectors connecting the first and second data lines; forming a passivation layer having an uneven surface and first and second contact holes exposing the first and the second drain electrodes respectively; and forming first and second pixel electrodes respectively connected to the first and the second drain electrodes through the first and the second contact holes, wherein a mask for forming at least one of the gate wire, the data wire, the semiconductor layer, the passivation layer and the pixel electrodes used in a first area is used in a second area by rotating 180 degrees.

According to an embodiment of the present invention, the mask comprises a plurality of opaque portions and a plurality of transparent portions. The plurality of transparent portions include a first portion with a first width, a second portion with a second width smaller than the first width, and a third portion with a third width lager than the second width and smaller than the first width, and the first portion corresponds to the first and second contact holes, the second portion to the data wire and the third portion to the remaining portions.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 8B is a sectional view taken along the line VIIIB––VIIIB' of FIG. 8A;

DETAILED DESCRIPTION OF PREFERRED EMBODIMENTS

Figure 1:
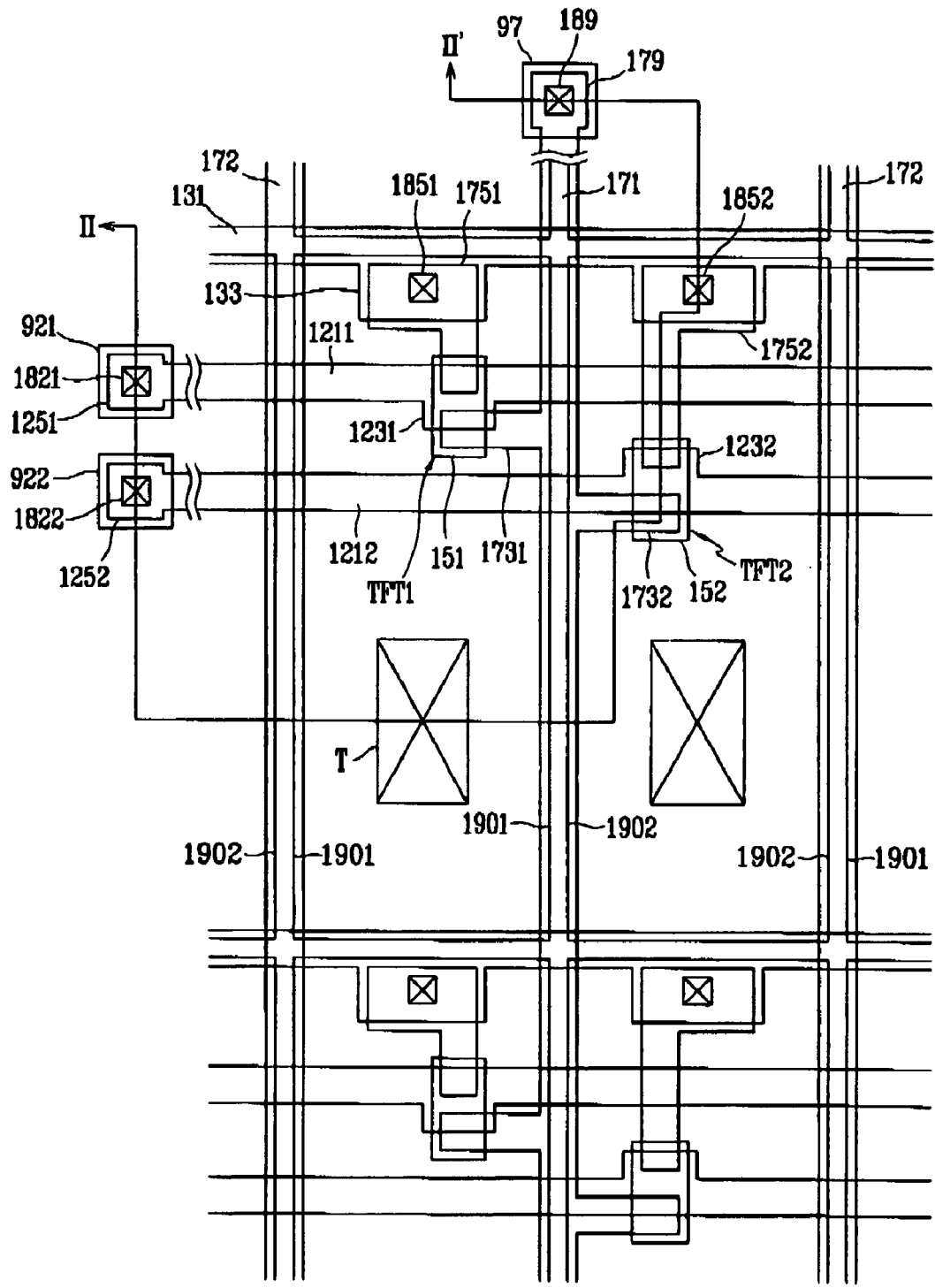
FIG. 1 is a layout view of a TFT array panel for a LCD according to a first embodiment of the present invention.

The present invention now will be described more fully hereinafter with reference to the accompanying drawings, in which preferred embodiments of the inventions are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

A TFT array panel for an LCD according to an embodiment of the present invention will be described more in detail with reference to the accompanying drawings.

First of all, a structure of a semi-transmission type TFT array panel according to a first embodiment of the present invention will be described with reference to FIGS. 1 and 2.

Figure 2:
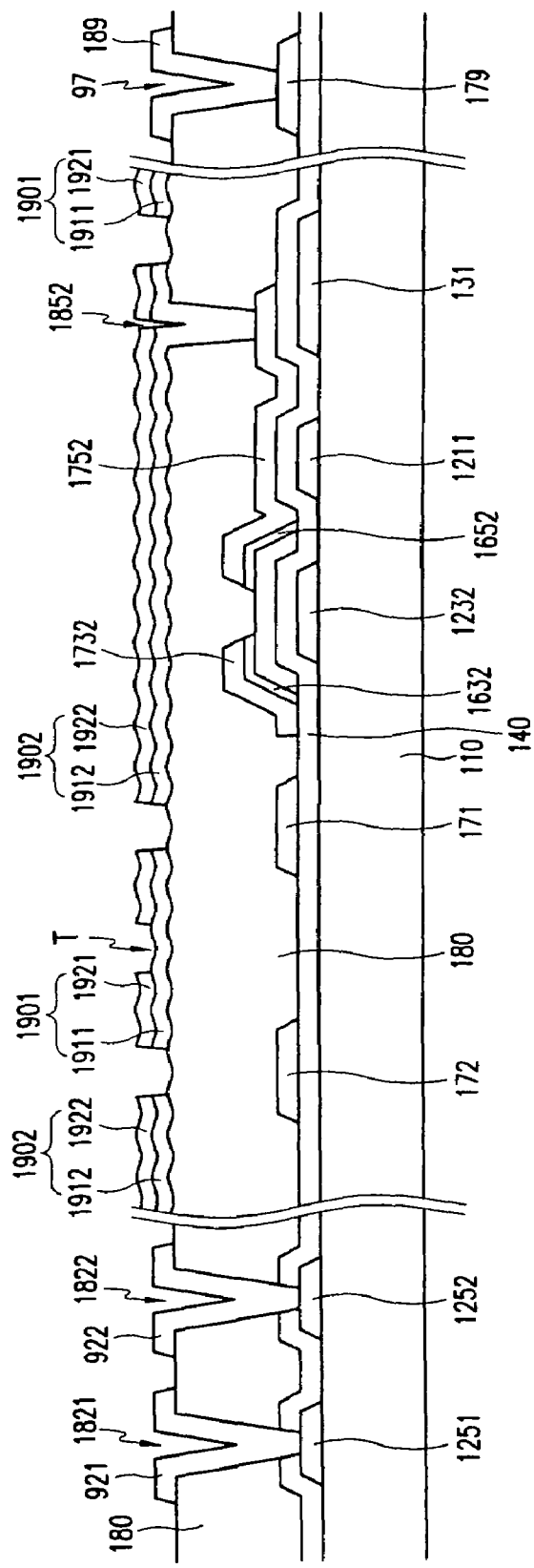
FIG. 2 is a sectional view taken along the line II–II' of FIG. 1.

FIG. 1 is a layout view of a structure of a TFT array panel for an LCD according to a first embodiment of the present invention, and FIG. 2 is a sectional view taken along the line II–II' of FIG. 1.

As shown in FIGS. 1 and 2, a gate wire made of conductive material or metal such as Al or Al alloy, Mo, MoW alloy, Cr, Ta, Cu or Cu alloy or conductive materials is formed on an insulating substrate. The gate wire includes a plurality of gate lines 1211 and 1212 extending in a horizontal direction, a pair of which are assigned to each row of pixels, a plurality of gate pads 1251 and 1252 connected to one ends of the respective gate lines 1211 and 1212 and transmitting gate signals from an external source to the associated gate lines 1211 and 1212, and a plurality of gate electrodes 1231 and 1232 of TFTs that are respectively connected to the gate lines 1211 and 1212 and alternately arranged.

Furthermore, a storage wire including a plurality of storage electrode lines 131 and a plurality of storage electrodes 133 connected thereto is formed on the substrate 110. The storage electrode lines 131 extend parallel to the gate lines 1211 and 1212 and are located between the pixel rows. Each storage electrode line 131 receives a voltage such as a common electrode voltage to be applied to a common electrode (not shown) of an upper panel (not shown). Each storage electrode 133 has a width larger than the related storage electrode line 131, and is assigned to the respective pixels. The storage wire 131 and 133 overlaps drain electrodes 1751 and 1752 electrically and physically connected to pixel electrodes 1901 and 1902, which will be described later, to form storage capacitors improving the charge storing capacity of the pixels. In addition, the storage electrode lines 131 overlap the edge portions of the pixel electrodes 1901 and 1902 to prevent the light leakage between the pixel areas.

The gate wire 1211, 1212, 1231, 1232, 1251 and 1252 and the storage wire 131 and 133 preferably have a single-layered structure made of a material including Al. Alternatively, they have a multiple-layered structure. In this case, it is desirable that one of the layers is made of a material with low resistance, and another of the layers is made of a conductive material having a good contact characteristic with other materials such as indium-tin-oxide (ITO), indium-zinc-oxide (IZO) and the substrate, the conductive material including Cr, Mo, Cr alloy and Mo alloy.

The gate wire 1211, 1212, 1231, 1232, 1251 and 1252 and the storage wire 131 and 133 are covered with a gate insulating layer 140 preferably made of silicon nitride (SiNx).

A semiconductor layer 151 and 152 made of a semiconductor such as amorphous silicon are formed on the gate insulating layer 140 opposite the gate electrodes 1231 and 1232, respectively. The semiconductor layer includes a plurality of semiconductor islands 151 and 152. An ohmic contact layer 1632 and 1252 preferably made of silicide or n+ hydrogenated amorphous silicon heavily doped with n-type impurity is formed on the semiconductor layer 151 and 152. The ohmic contact layer 1632 and 1252 has two portions 1632 and 1252 separated with respect to each gate electrode 1231 or 1232.

A data wire preferably made of a conductor or metal such as Al, Al alloy, Mo, MoW alloy, Cr and Ta is formed on the ohmic contact layer 1632 and 1652 and the gate insulating layer 140.

The data wire includes a plurality of data lines 171 extending in a vertical direction and intersecting the gate lines 1211 and 1212 to define pixel areas. Each data line 171 is placed between the adjoining pixel rows and assigned to every two pixel rows.

The data wire further includes a plurality of source electrodes 1731 and 1732 and a plurality of drain electrodes 1751 and 1752 opposite each other. A pair of source electrodes 1731 and 1732 are connected to one data line 171 and extend to the respective gate electrodes 1231 and 1232 opposite each other with respect to the associated data line 171. A pair of drain electrodes 1751 and 1752 are separated from and located opposite the respective source electrodes 1731 and 1732 with respect to the associated gate electrodes 1751 and 1752. The drain electrodes 1751 and 1752 overlap the storage wire 131 and 133 to form storage capacitors.

The data wire also includes a plurality of data pads 179 connected to one ends of the data lines 171 to receive image signals from an external source.

In addition, the data wire include a plurality of subsidiary signal lines 172 extending in the vertical direction to be parallel to the data lines 171, and placed between the pixel columns. The data lines 171 and the subsidiary signal lines 172 are alternately arranged between the adjoining pixel rows and overlap edge portions of the pixel electrodes 1901 and 1902, which will be formed later, to block the light leakage between the pixel columns. The subsidiary signal lines 172 can be used as repair lines for the data lines 171 and the gate lines 1211 and 1212. That is, when the data lines 171 or the gate lines 1211 and 1212 are cut, the subsidiary signal lines 172 becomes bypaths for the cut portions of the data lines 171 or the gate lines 1211 and 1212. The subsidiary signal lines 172 perform the same function as the storage wire 131 and 133 instead of the storage wire 131 and 133.

The data wire 171, 1731, 1732, 1751, 1752 and 179 and the subsidiary signal lines 172 have a single-layered structure including Al or Al ally or a multiple-layered structure. In the latter case, it is desirable that one of the layers is made of a material with low resistance and another layer is made of material having good contact characteristic with other materials. Layers of Cr/Al (or Al alloy) or Al/Mo are the examples. In the Cr/Al structure, Cr prevents Al or Al alloy from being defused into the silicon layers 151, 152, 1632 and 1652 as well as secures the contact characteristic between the data wire 171, 1731, 1732, 1751, 1752 and 179 and the pixel electrodes 1901 and 1902.

A passivation layer 180 is formed on the data wire 171, 1731, 1732, 1751, 1752 and 179 and portions of the semiconductor layer 151 and 152 which are not covered by the data wire 171, 1731, 1732, 1751, 1752 and 179. The passivation layer 180 is preferably made of silicon nitride or an acrylic photoresistive organic material with good flatness characteristic and low permittivity. The passivation layer 180 has a plurality of contact holes 1851, 1852 and 189 respectively exposing the drain electrodes 1751 and 1752 and the data pads 179, and contact holes 1821 and 1822 exposing the gate pads 1251 and 1252 together with the gate insulating layer 140.

In the figures, the passivation layer 180 is resided near the pads 1251, 1252 and 179. However, it is desirable that the organic material of the passivation layer 180 near the pads 1251, 1252 and 179 is removed, because the organic material reduces adhesiveness of the pads 1251, 1252 and 179, which will be described layer. Meanwhile, the surface of the passivation layer 180 is rugged to cause unevenness of the pixel electrodes 1901 and 1902.

A pixel wire is formed on the passivation layer 180. The pixel wire includes a plurality of pixel electrodes 1901 and 1902 connected to the drain electrodes 1751 and 1752 through the contact holes 1851 and 1852, respectively, and a plurality of subsidiary gate pads 921 and 922 and subsidiary data pads 97 connected to the gate pads 1251 and 1252 and the data pads 179 through the contact holes 1821, 1822, and 189, respectively.

Each pixel electrode 1901 or 1902 includes a transparent conductive film 1911 or 1912 and a reflecting conductive film 1921 or 1922 thereon. The transparent conductive films 1911 and 1912 are preferably made of transparent material such as indium tin oxide (ITO) and indium zinc oxide (IZO), and the reflecting conductive films 1921 and 1922 are preferably made of Al, Al alloy, Ag or Ag alloy. The reflecting conductive films 1921 and 1922 have transmission portions T exposing the transparent conductive films 1911 and 1921. The transmission type LCD may include only the transparent conductive films 1911 and 1912 without the reflecting conductive films 1921 and 1922.

As briefly described above, compared with silicon nitride, the organic insulating material is very poor in adhesiveness, chemical resistance, hardness, mechanical strength and stress, etc. As a result, the defect in adhesion easily occurs in pad portions due to the poor adhesiveness between the subsidiary pads of the TFT array panel and corresponding driving ICs or flexible printed circuit ("FPC") films, respectively for chip-on-glass ("COG") type mounting of the driving ICs, which mounts the driving ICs directly on a TFT array panel for an LCD, and tape-carrier package ("TCP") type or chip-on-film ("COF") type mounting, which mounts the driving ICs on a flexible printed circuit ("FPC") film where the driving ICs. The defect in adhesion often requires reworks including detachment of the driving ICs or the film from the pad portion by chemical or mechanical method and removal of an anisotropic conductive film used for attaching the pads. This reworks may damage the surface of the pad portion and flake away the organic insulating layer and the subsidiary pads 921, 922, and 97. Therefore, complete removal of the organic insulating materials near the pad portion improves the adhesion between the driving ICs or the films and the pads and causes very easy reworks.

Figure 3:
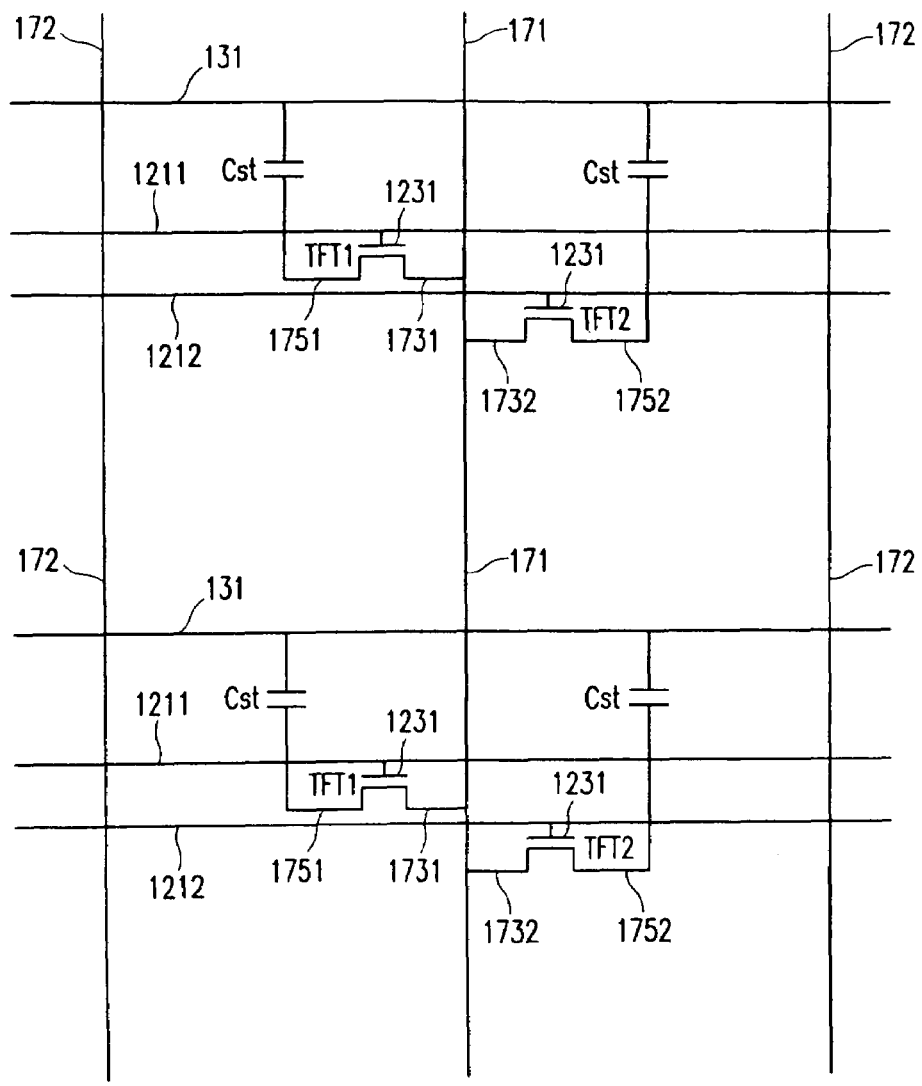
FIG. 3 is an equivalent circuit diagram of a TFT array panel for a LCD according to an embodiment of the present invention.

FIG. 3 is an equivalent circuit diagram of a TFT array panel for an LCD according to an embodiment of the present invention.

As shown in FIGS. 1 to 3, a pair of gate lines 1211 and 1212 and a data line 171 are provided. Each pixel of a TFT array panel for an LCD according to an embodiment of the present invention has two subpixels oppositely located with respect to the respective data line 171. The pixel electrodes 1901 and 1902 of the respective subpixels oppositely located with respect to the data line 171 are connected to the relevant data line 171 through respective TFTs (TFT1 and TFT2). The dual gate lines 1211 and 1212 are electrically connected to the TFTs (TFT1 and TFT2) including the gate electrodes 1231 and 1242 connected thereto, respectively.

In the TFT array panel for an LCD according to this embodiment of the present invention, when the pixel electrodes are arranged in m×n matrix, the number of the data lines 171 decreases into n/2 because each data line 171 transmits image signals to the two pixel electrodes adjacent thereto, and the number of the gate lines 1211 and 1212 is doubled. The sum of the number of gate lines 1211 and 1212 and the number of the data lines 171 equals to the number of output terminals of the gate and the data driving ICs. In general, since the number of the data lines is greater than that of the gate lines, the total number of the signal lines is reduced in this embodiment. For example, the numbers of the gate and the data lines of a wide video graphics array ("WVGA") scale LCD are 480 and 2400, respectively, and thus the number of the total signal lines is 2880. However, in the structure of this invention, since the number of the gate lines 1211 and 1212 is doubled to become 960 while the number of the data lines 171 decreases to half, i.e., 1200, the number of the total signal lines in this embodiment becomes 2160. Therefore, the number of the total signal lines in this structure of the present invention is reduced by about 25% compared with the conventional art. As a result, the number of the driving ICs, particularly the number of the expensive data driving ICs is reduced, thereby minimizing the manufacturing costs of an LCD.

Meanwhile, the data lines 171, the subsidiary signal lines 172 and the storage wire 131 and 133 overlap the edge portions of the pixel electrodes 1901 and 1902 adjacent thereto to block the light leakage between the pixel electrodes.

A structure of a TFT array panel for a transmission type LCD according to a second embodiment of the present invention will be described in detail with reference to FIGS. 4 and 5.

Figure 4:
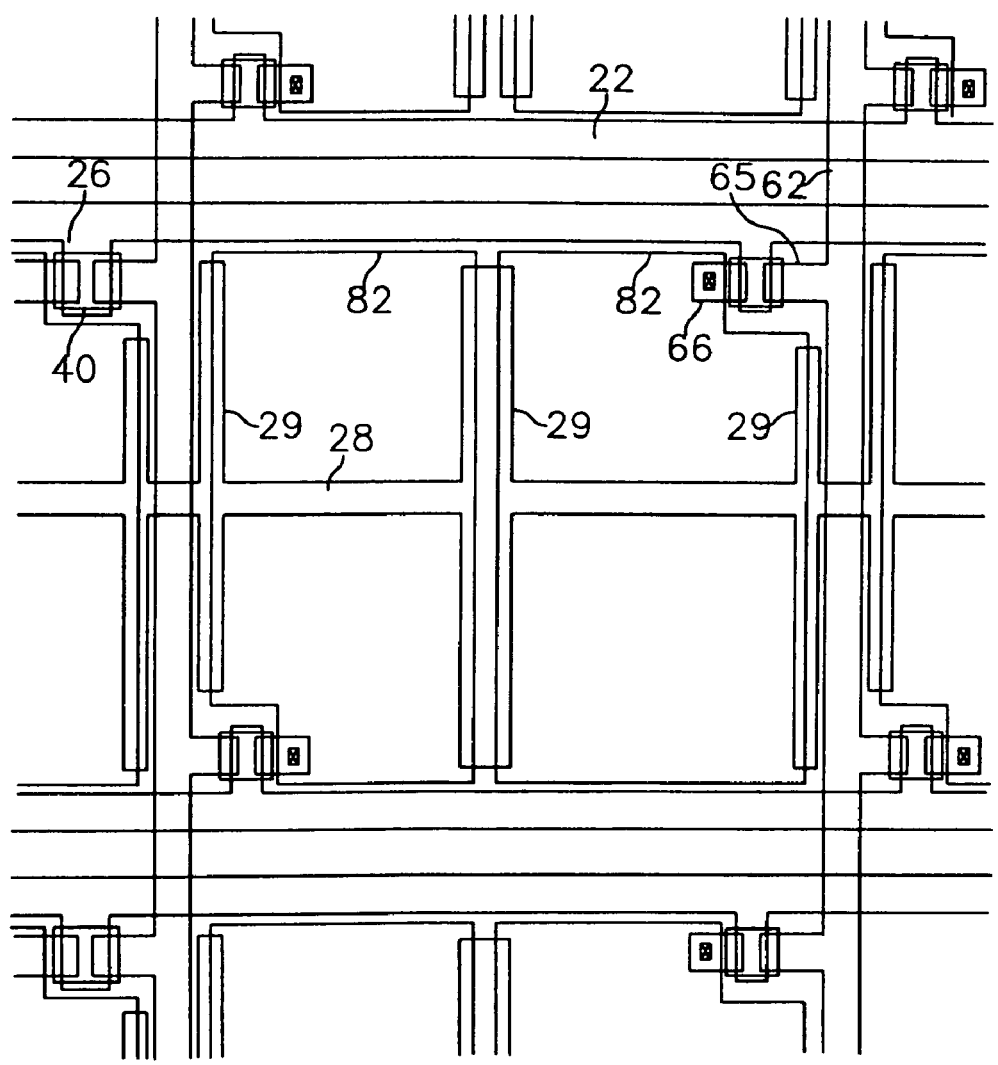
FIG. 4 is a layout view of a TFT array for a LCD according to a second embodiment of the present invention.
Figure 5:
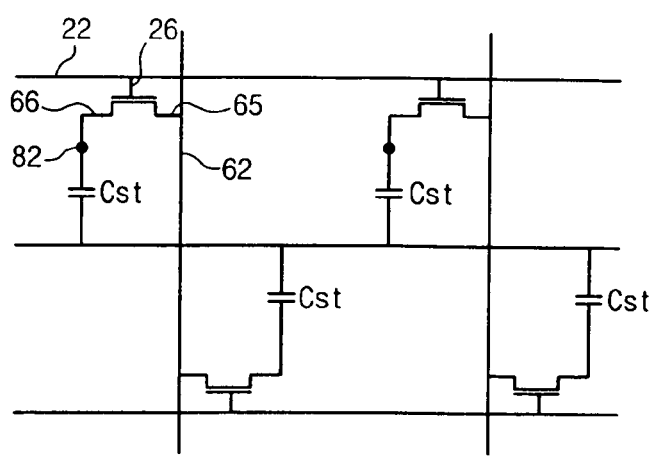
FIG. 5 is an equivalent circuit diagram of a TFT array panel for a LCD according to an embodiment of the present invention.

FIG. 4 is a layout view of a TFT array panel for a transmission type LCD according to a second embodiment of the present invention, and FIG. 5 is an equivalent circuit diagram of a TFT array panel for an LCD according to an embodiment of the present invention.

As shown in FIGS. 4 and 5, a gate wire and a data wire including conductive material or metals with low resistance such as a metal of Al group, Mo, MoW alloy, Cr or Ta are provided.

The gate wire includes a plurality of gate lines 22 extending in a horizontal direction and a plurality of gate electrodes 26 of TFTs (TFT1 and TFT2) connected to the gate lines 22. The gate wire may further include a plurality of gate pads connected to one ends of the gate lines 22 to transmit gate signals from a plurality of gate driving ICs to the gate lines 22.

The data wire includes a plurality of data lines 62 extending in a vertical direction. The data lines 62 are insulated from and intersect the gate lines 22. The data wire further includes a plurality of source electrodes 65 of the TFTs (TFT1 and TFT2) and a plurality of drain electrodes 66. The source electrodes 65 are connected to the respective data lines 62, and the drain electrodes 66 are separated from the source electrodes 65 and located opposite the source electrodes 65 with respect to the gate electrodes 26. The data wire may further include a plurality of data pads connected to one ends of the data lines 62 and receiving image signals from a plurality of data driving ICs to transmit the signals to the data lines 62.

A plurality of pixel electrodes 82 are also provided. The pixel electrodes 82 are electrically connected to the data wire 62, 65 and 66 through the drain electrodes 66 of the TFTs (TFT1 and TFT2) and preferably made of a transparent conductive material such as ITO and IZO, or a material with a good reflectance. The pixel electrodes 82 may overlap the gate lines 22 to form a storage capacitor.

Each TFT (TFT1 or TFT2) includes a semiconductor island 40 where channels are generated. The semiconductor island 40 overlaps the gate electrodes 26, the source electrodes 65 and the drain electrodes 66.

A storage wire 28 and 29 overlapping the pixel electrodes 82 to form storage capacitors are further provided as shown in the figures. The storage wire includes a plurality of storage electrode lines 28 extending in the horizontal direction and a plurality of storage electrodes 29 connected to the storage electrode lines 28. The storage electrodes 29 extend in the vertical direction and overlap the edges of the pixel electrodes 82.

Each pixel of the TFT array panel for an LCD according to the second embodiment of the present invention has two subpixels oppositely arranged with respect to the data wire 62, 65 and 66. The two gate lines 22 and 26 are located near an upper edge and a lower edge of the pixel electrodes 82, respectively. The pixel electrodes 82 of the respective subpixels oppositely located with respect to the data line 62 are connected to the relevant data line 62 through respective TFTs (TFT1 and TFT2). The upper and the lower gate lines 22 and 26 are electrically connected to the TFTs (TFT1 and TFT2) including the gate electrodes connected thereto, respectively.

The TFT array panel for a transmission type LCD according to the second embodiment of the present invention reduces the total number of the driving ICs, specifically the number of the expensive data driving ICs. As a result, the manufacturing costs of the LCD can be minimized.

In addition, the aperture ratio of the pixel areas is increased because one data line 62 is assigned to every two pixel electrodes. The storage electrodes 29 located between the pixel electrodes 82 reduce coupling effect occurring between the pixel electrodes 82. Furthermore, the light leakage between the pixel electrodes 82 is prevented by placing the storage electrodes 29 edges of the pixel electrodes 82.

In a method of manufacturing the TFT of an LCD according to the second embodiment of the present invention, a conductive layer including a conductive material such as Al or Al alloy with low resistance are deposited on a substrate and patterned by photoetch using photoresist to form a gate wire 22 and 26 and a storage wire 28 and 29. The gate wire 22 and 26 and the storage wire 28 and 29 may have either a single-layered structure including a material such as Al or Al alloy or a multiple-layered structure including such a layer.

Next, a gate insulating layer preferably made of SiNx is deposited on the substrate 10. The gate insulating layer covers the gate wire 22 and 26 and the storage wire 28 and 29.

Then, a semiconductor layer preferably made of amorphous silicon and an ohmic contact layer preferably made of silicide or n+ hydrogenated amorphous silicon heavily doped with n-type impurities are consequently deposited on the substrate 10 and patterned.

A conductive material with low resistance such as Al or Al alloy is deposited on the substrate 10 and patterned by photoetch using photoresist to form a data wire 62, 65 and 66. The data wire 62, 65 and 66 may have either a single-layered structure including a material such as Al or Al alloy or a multiple-layered structure including such a layer. Next, exposed portions of the ohmic contact layer are etched using the data wire 62, 65 and 66 or a photoresist pattern for forming the data wire 62, 65 and 66 to separate the ohmic contact layer into two portions respectively located under the source electrodes 65 and the drain electrodes 66 and to expose portions of a semiconductor island 40 between the separated two portions.

The semiconductor island 40 and the data wire 62, 65 and 66 may be formed by one photoetch step using a photoresist pattern with differentiated thickness in part.

Subsequently, silicon nitride or an organic material with low permittivity and with good flatness characteristic is deposited to form a passivation layer covering the semiconductor layer 40. Then, the passivation layer and the gate insulating layer are patterned by photoetch using a photoresist pattern to form a plurality of contact holes exposing the drain electrodes 66, the data pads and the gate pads.

Finally, a conductive material such as ITO or IZO is deposited and patterned using a mask to form a plurality of pixel electrodes 82, a plurality of subsidiary gate pads and a plurality of subsidiary data pads, respectively connected to the drain electrodes 66, the gate pads 24 and the data pads 68.

A structure of a TFT array panel for a reflecting type LCD according to a third embodiment of the present invention will be described in detail with reference to FIGS. 6 and 7.

Figure 6:
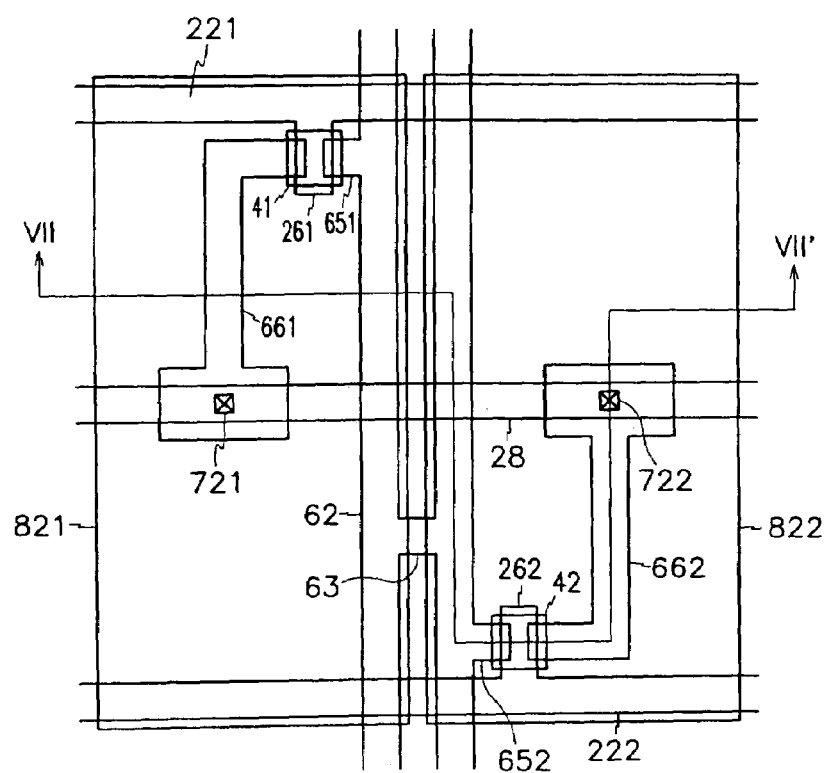
FIG. 6 is a layout view of a TFT array panel for an LCD according to a third embodiment of the present invention.
Figure 7:
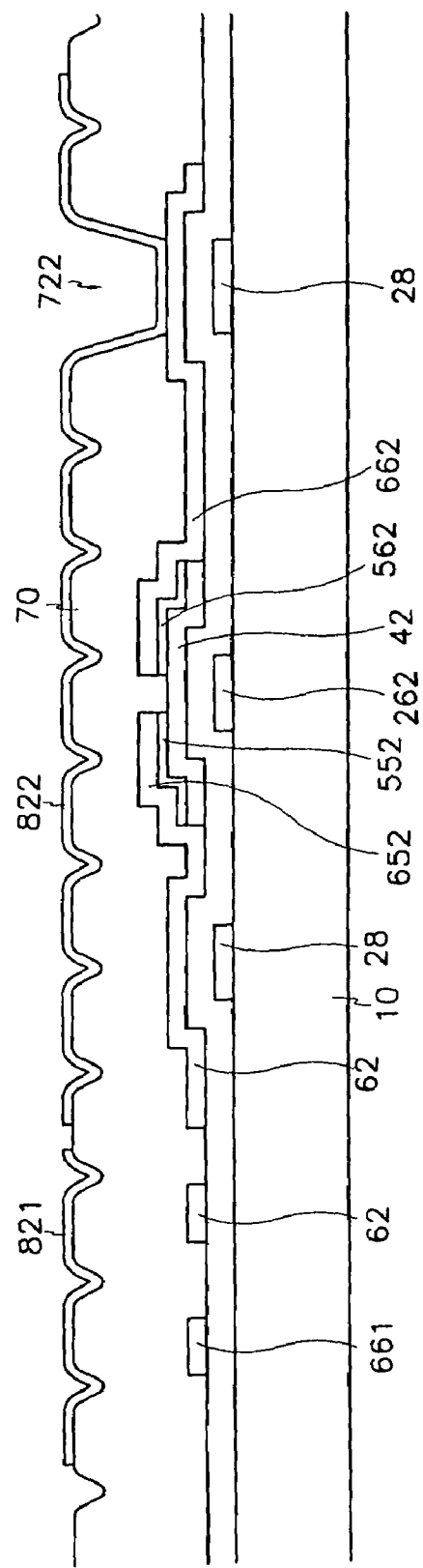
FIG. 7 is a sectional view taken along the line VII–VII' of FIG. 6.

FIG. 6 is a layout view of a TFT array panel for an LCD according to a third embodiment of the present invention, and FIG. 7 is a sectional view taken along the line VII–VII' of FIG. 6.

As shown in FIGS. 6 and 7, a gate wire and a plurality of storage lines 28 preferably made of conductive material or metal such as Al or Al alloy, Mo, MoW alloy, Cr or Ta are formed on an insulating substrate 10.

The gate wire includes a plurality of gate lines 221 and 222 extending in a horizontal direction, and a plurality of first and second gate electrodes 261 and 262 of first and second TFTs (TFT1 and TFT2), which are parts of the gate lines 211 and 212. The gate wire may further include gate pads (not shown) connected to ends of the respective gate lines 211 and 212 to transmit scanning signals from an external source to the gate lines 211 and 212.

The gate wire 221, 222, 261, and 262 and the storage lines 28 may have a single-layered structure, a double-layered structure or a triple-layered structure. In the case of the multiple-layered structure, one layer is made of a low resistance material, and the other layer is made of a material bearing a good contact characteristic with other materials. For instance, Cr/Al (or Al alloy), or Al (or Al alloy)/Mo may be used for that purpose.

A gate insulating layer 30 preferably made of silicon nitride is formed on the gate wire 221, 222, 261 and 262 and the storage lines 28.

First and second semiconductor islands 41 and 42 preferably made of amorphous silicon are formed on the gate insulating layer 30 opposite the first and the second gate electrodes 262 and 261, respectively. An ohmic contact layer 552 and 562 preferably made a semiconductor material such as amorphous silicon doped with n-type impurities such as phosphorus (P) is formed on the first and the second semiconductor islands 41 and 42. The ohmic contact layer has two separated portions 552 and 562 opposite each other with respect to the first and the second gate electrodes 261.

A data wire 62, 651, 652, 661, 662, and 63 preferably made of conductive material or metal such as Al or Al alloy, Mo, MoW alloy, Cr or Ta is formed on the ohmic contact layer 552 and 562, or the gate insulating layer 30. The data wire includes a plurality of data lines 62 extending in a vertical direction, a plurality of first and second source electrodes 651 and 652 that are parts of the data lines 62, first drain electrodes 661 opposite the first source electrodes 651 with respect to the first gate electrodes 261, a plurality of second drain electrodes 662 opposite the second source electrodes 652 with respect to the second gate electrodes 262, and a plurality of data connectors 63 connecting each pair of the data lines 62. The data wire may include a plurality of data pads (not shown) connected to the data lines 62, and receiving image signals from an external source to transmit the image signals to the associated data lines 62.

The first gate electrode 261, the first semiconductor island 41, the first source electrode 651 and the first drain electrode 661 form a first TFT (TFT1), and the second gate electrode 262, the second semiconductor island 42, the second source electrode 652 and the second drain electrode 662 form a second TFT (TFT2).

As the same as the gate wire 221, 222, 261 and 262, the data wire 62, 651, 652, 661, 662 and 63 may have a single-layered structure, a double-layered structure or a triple-layered structure. In the case of the multiple-layered structure, one layer is made of a low resistance material, and the other layer is made of a material bearing a good contact characteristic with other materials.

A passivation layer 70 preferably made of a photoresistive organic insulating layer is formed on the data wire 61, 651, 652, 661, 662 and 63 and the gate insulating layer 30. The passivation layer 70 has unevenness and has a plurality of contact holes 721 and 722 respectively exposing the drain electrodes 651 and 652.

First and second pixel electrodes 821 and 822 preferably made of a metal with good reflectance such as Al, Al alloy, Ag or Ag alloy are formed on the passivation layer 70. The unevenness of the pixel electrodes 821 and 822 due to the uneven surface of the passivation layer 70 increases the reflectance of the pixel electrodes 821 and 822.

The first and the second pixel electrodes 821 and 822 are connected to the first and the second drain electrodes 651 and 652 through the contact holes 721 and 722, respectively, to receive image signals. The first and the second pixel electrodes 821 and 822 receive the same image signals because a pair of data lines 62 are connected to each other via the data connector 63.

Meanwhile, the first gate electrode 261, the first source electrode 651 and the first drain electrode 661 has the rotational symmetry to the second gate electrode 262, the second source electrode 652 and the second drain electrode 662.

In the third embodiment of the present invention, the light leakage between the pixel electrodes 821 and 822 is blocked by placing the gate lines 221 and 222 near the upper and the lower portions of the pixel electrodes 821 and 822 and sufficiently overlapping the gate lines 221 and 222 and the data lines 62 with the edges of the pixel electrodes 821 and 822 made of a reflective material. In addition, the dot symmetry of the structure of the pixel areas results in uniform reflectance. This will be described in detail through a manufacturing process.

A method of manufacturing a TFT array panel for an LCD according to the third embodiment of the present invention will be described with reference to FIGS. 8A to 12B.

Figure 8A:
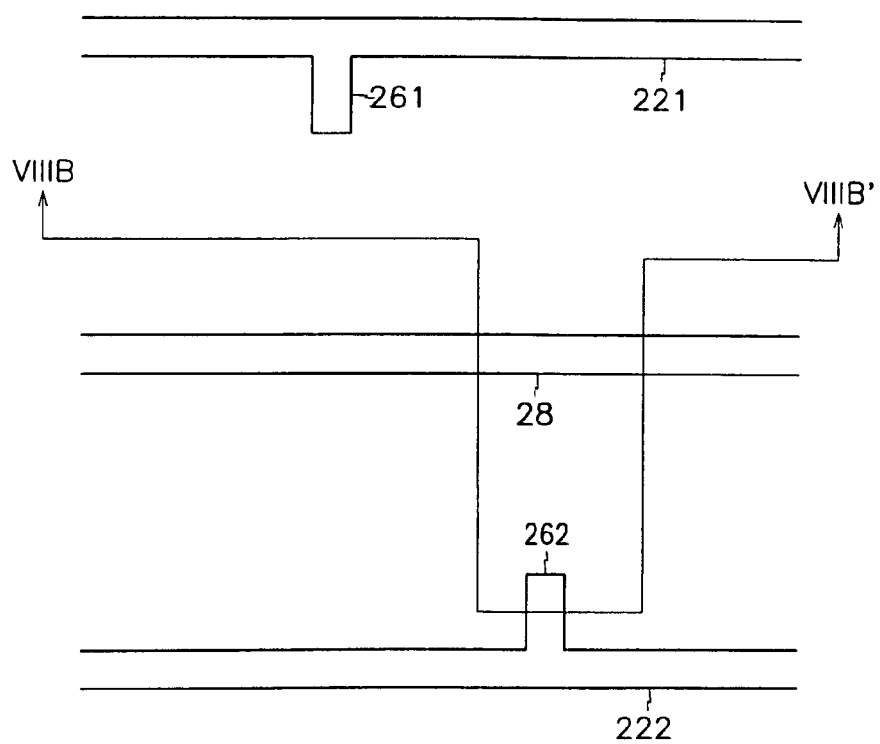
FIG. 8A is a layout view illustrating the first step of manufacturing a TFT array panel according to the third embodiment of the present invention.

First, as shown in FIGS. 8A and 8B, a conductive material or a metal for a gate wire with a thickness of 1,000–3,000 Å is deposited on an insulating substrate 10 by sputtering, etc., and patterned by photoetch using a mask to form a gate wire including a plurality of gate lines 221 and 222 and a plurality of gate electrodes 261 and 262 and a plurality of storage lines 28.

Figure 9A:
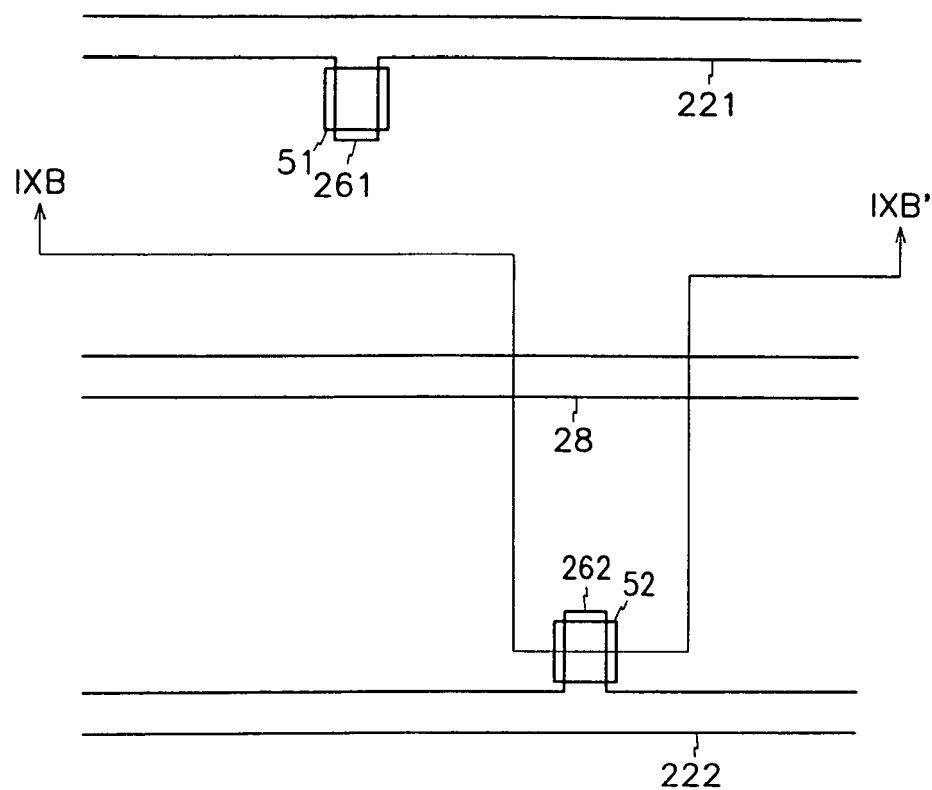
FIG. 9A is a layout view showing a step following the step shown in FIG. 8A.
Figure 9B:
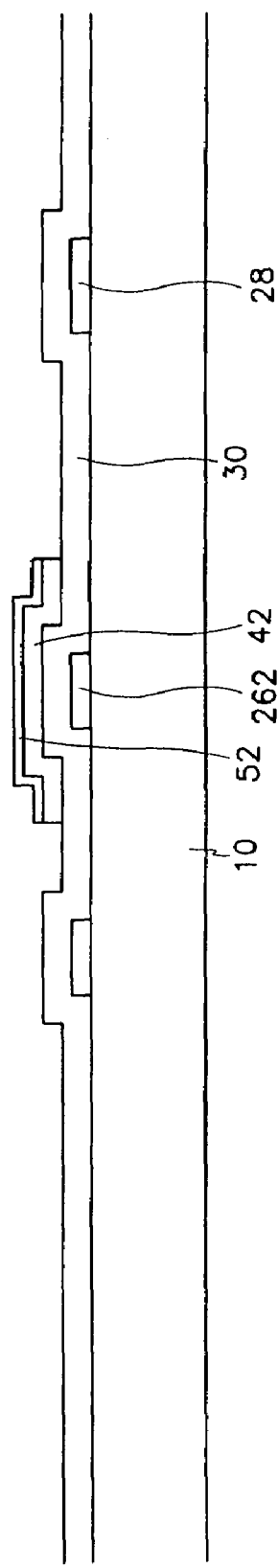
FIG. 9B is a sectional view taken along the line IXB–IXB' of FIG. 9A.

Thereafter, as shown in FIGS. 9A and 9B, a silicon nitride layer 30, an amorphous silicon layer and a doped amorphous silicon layer doped with n-type impurities, bearing a thickness of 1,500–5,000 Å, 500–1,500 Å and 300–600 Å, respectively, are sequentially deposited by chemical vapor deposition ("CVD"), etc. Then, the three layers are patterned by photoetch using a mask to form a gate insulating layer 30, a plurality of semiconductor islands 41 and 42 and an ohmic contact layer 51 and 52.

Figure 10A:
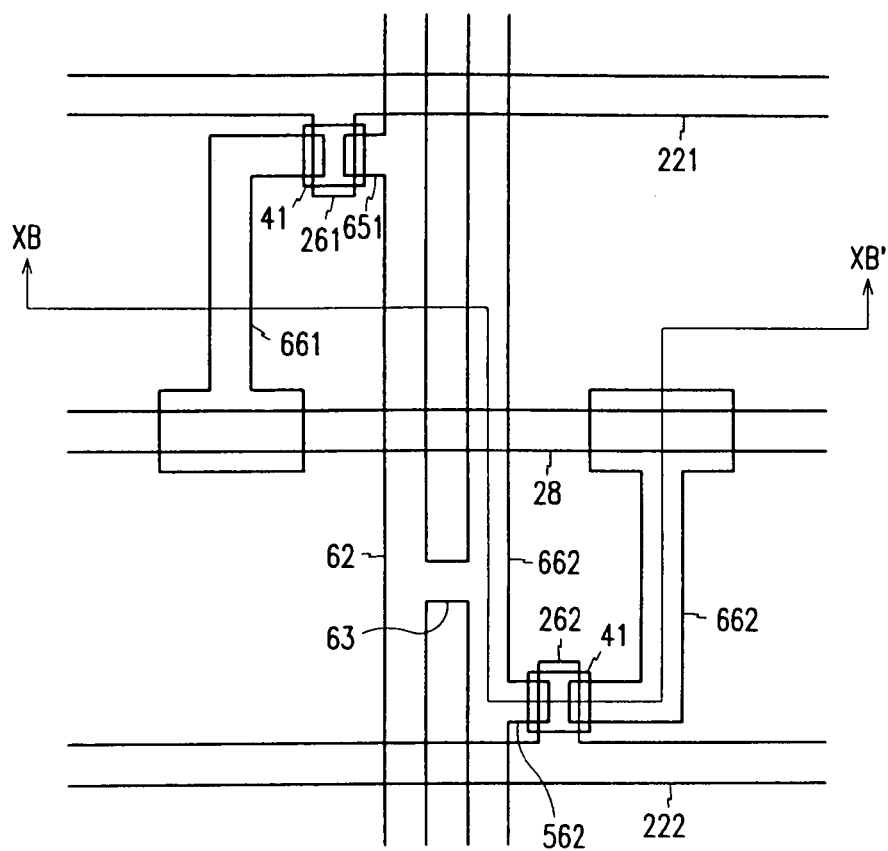
FIG. 10A is a layout view showing a step following the step shown in FIG. 9A.
Figure 10B:
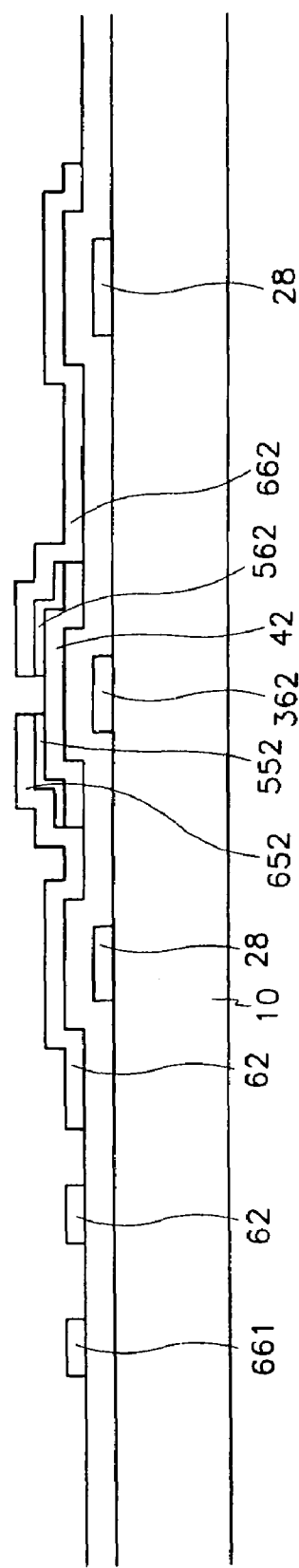
FIG. 10B is a sectional view taken along the line XB–XB' of FIG. 10A.

As shown in FIGS. 10A and 10B, a conductive material or a metal for a data wire with a thickness of 1,500–3,000 Å is deposited by sputtering, etc., and patterned by photoetch using a mask to form a data wire including a plurality of data lines 62, a plurality of source electrodes 651 and 652, a plurality of drain electrodes 661 and 662 and a plurality of data connectors 63. Then, portions of the ohmic contact layer 51 and 52, which are not covered by the source electrodes 651 and 652 and the drain electrodes 661 and 662, are removed to separate the ohmic contact layer 51 and 52 into two portions 551, 552, 561 and 562 with respect to the gate electrodes 261 and 262 and to expose the semiconductor islands 41 and 42.

Figure 11:
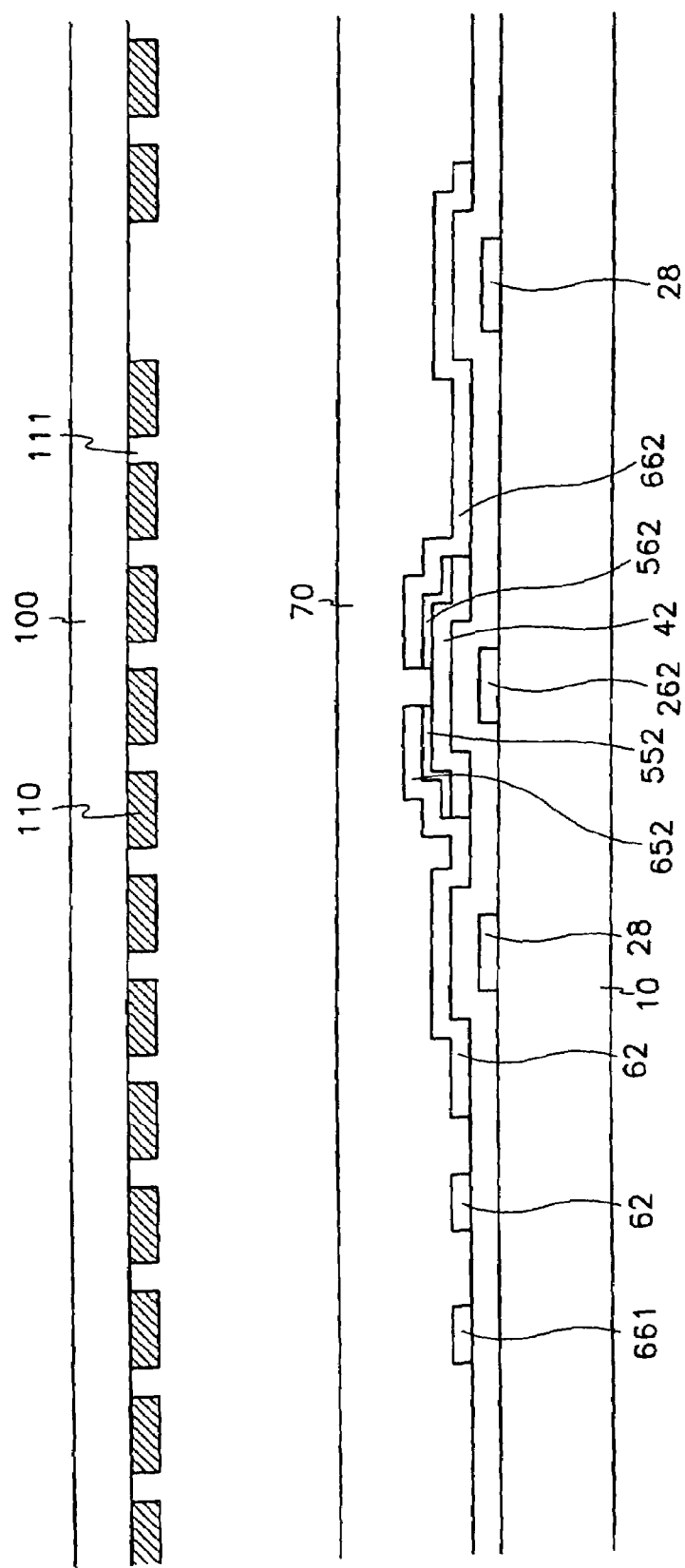
FIG. 11 is a layout view showing a step following the step shown in FIG. 10A.
Figure 12A:
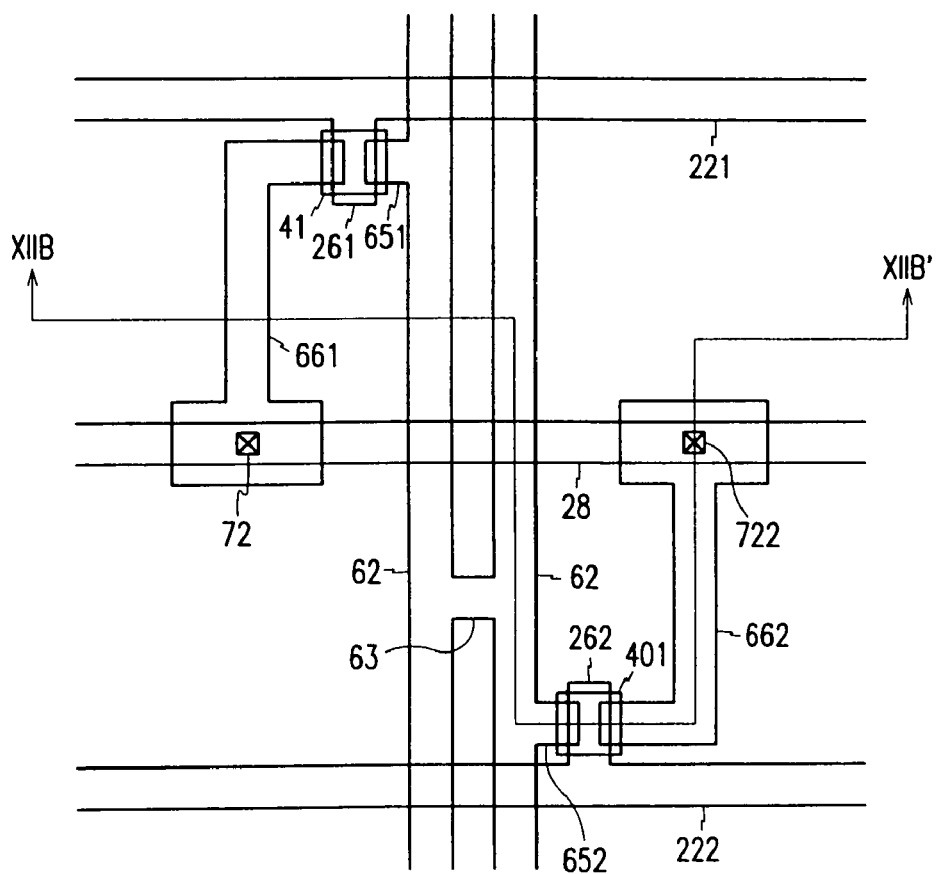
FIG. 12A is a layout view showing a step following the step shown in FIG. 11.
Figure 12B:
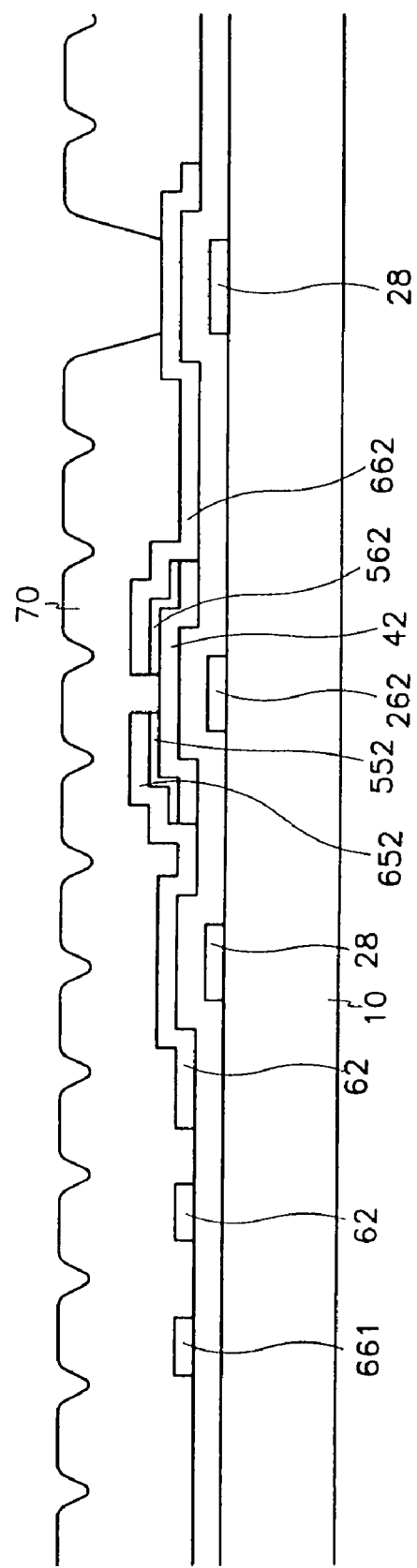
FIG. 12B is a sectional view taken along the line XIIB–XIIB' of FIG. 12B.

Next, as shown in FIGS. 11 to 12B, a passivation layer 70 made of a photoresistive organic insulating material with a thickness of several microns is coated and patterned by photoetch using a mask 100 to form a plurality of contact holes respectively exposing the drain electrodes 661 and 662 as well as unevenness on the surface of the passivation layer 70.

The mask 100 used in this step includes a plurality of opaque portions 110 preferably made of Cr and a plurality of transparent portions 111. The contact holes 721 and 722 correspond to the transparent portions 111. The unevenness of the surface of the passivation layer 70 is obtained by alternately arranging the opaque portions 110 and the transparent portions 111. When a light is applied through the mask 100, since the data wire 62, 651, 652, 661, 662 and 63 reflects the incident light, portions of the passivation layer 70 on the data wire 62, 651, 652, 661, 662 and 63 are over-exposed. As a result, after development, the thickness of the portions of the passivation layer 70 on the data wire 62, 651, 652, 661, 662 and 63 becomes reduced to cause the unevenness to be non-uniform. Therefore, it is desirable that the width of the transparent portion 111 opposed to the portions of the passivation layer 70 on the data wire 62, 651, 652, 661, 662 and 63 is small enough to reduce the amount of light incident on those portions compared with the other portions.

Since the data wire 62, 651, 652, 661, 662 and 63 in adjacent two areas having a first pixel electrode 821 and a second pixel electrode 822, respectively, has the same shapes when rotated by 180 degrees, the mask used for one of the areas can be used for the other area by rotating the mask by 180 degrees.

Next, as shown in FIGS. 6 and 7, a metal with high reflectance such as Al, Al alloy, Ag or Ag alloy with a thickness of 400–500 Å is deposited on the passivation layer 70 by sputtering, etc., and patterned by photoetch using a mask to form a plurality of first and second pixel electrodes 821 and 822.

As described above, the uniformly uneven surface of the passivation layer 70 increases the reflectance of the pixel electrodes 821 and 822 thereon.

In the third embodiment of the present invention, the uniform unevenness of the passivation layer is obtained in a manner that the mask used in an area is also used in the other area by rotating by 180 degrees. It may be obtained by aligning a mask in alternative ways. The description of a fourth embodiment of the present invention with reference to FIGS. 13 to 19B will show this feature.

Figure 13:
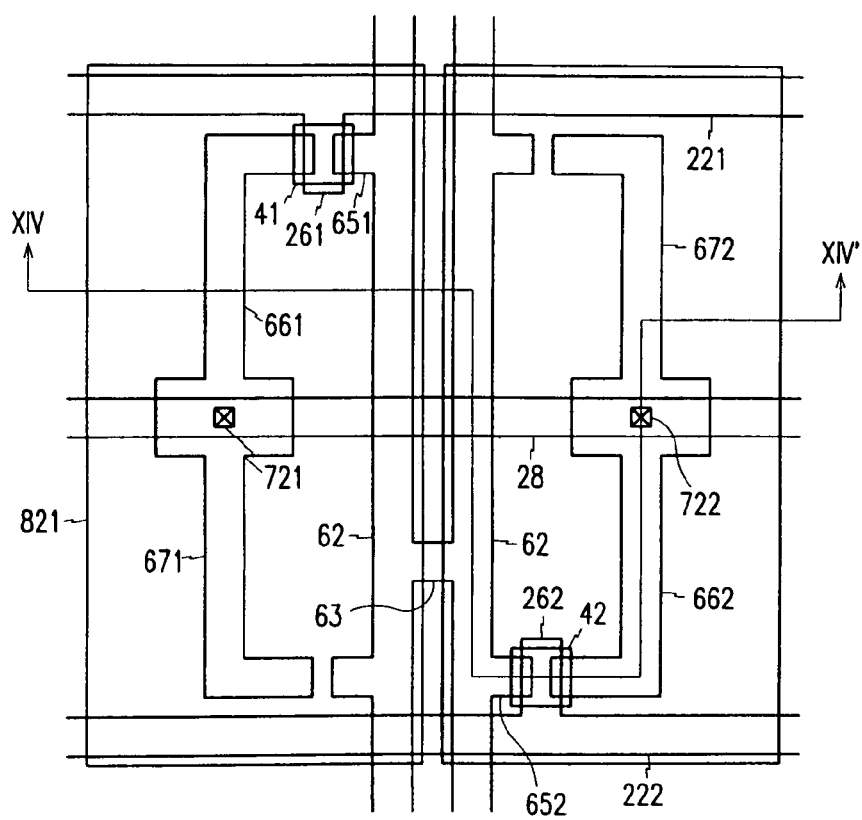
FIG. 13 is a layout view illustrating a TFT array panel for an LCD according to a fourth embodiment of the present invention.
Figure 14:
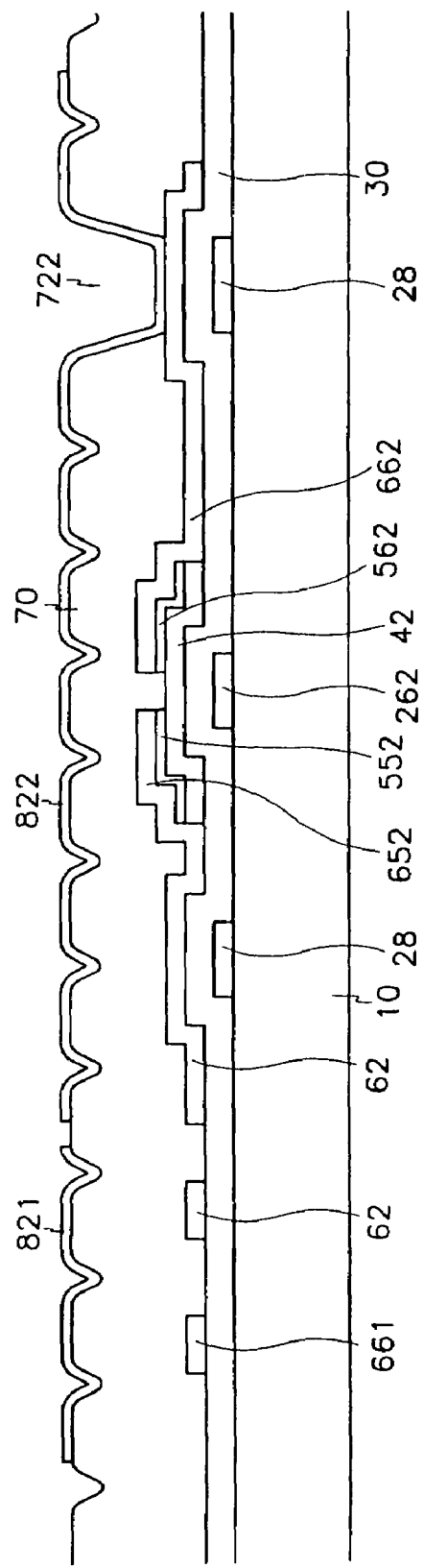
FIG. 14 is a sectional view taken along the line XIV–XIV' of FIG. 13.
Figure 15A:
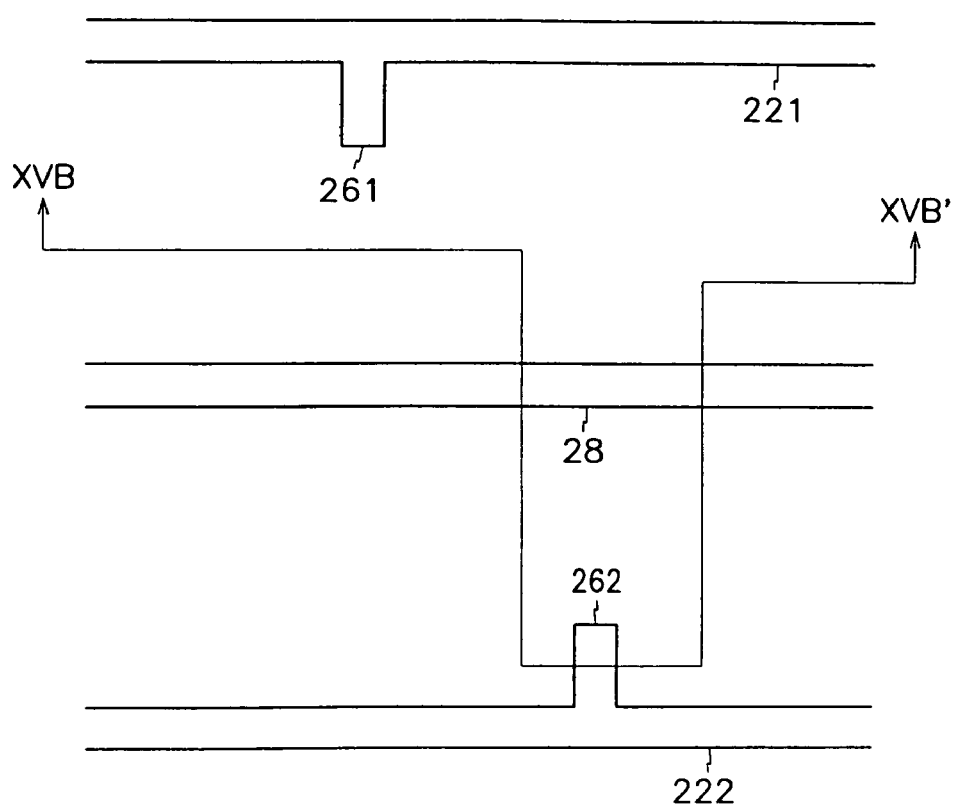
FIG. 15A is a layout view illustrating the first step of manufacturing a TFT array panel according to the fourth embodiment of the present invention.
Figure 15B:
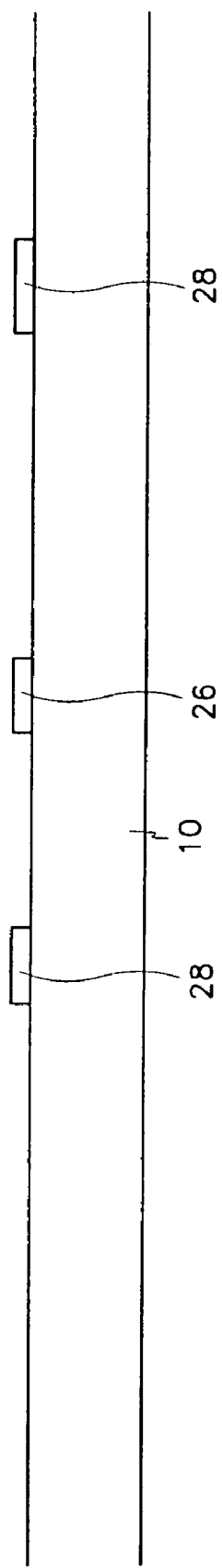
FIG. 15B is a sectional view taken along the line XVB–XVB' of FIG. 15A.
Figure 16A:
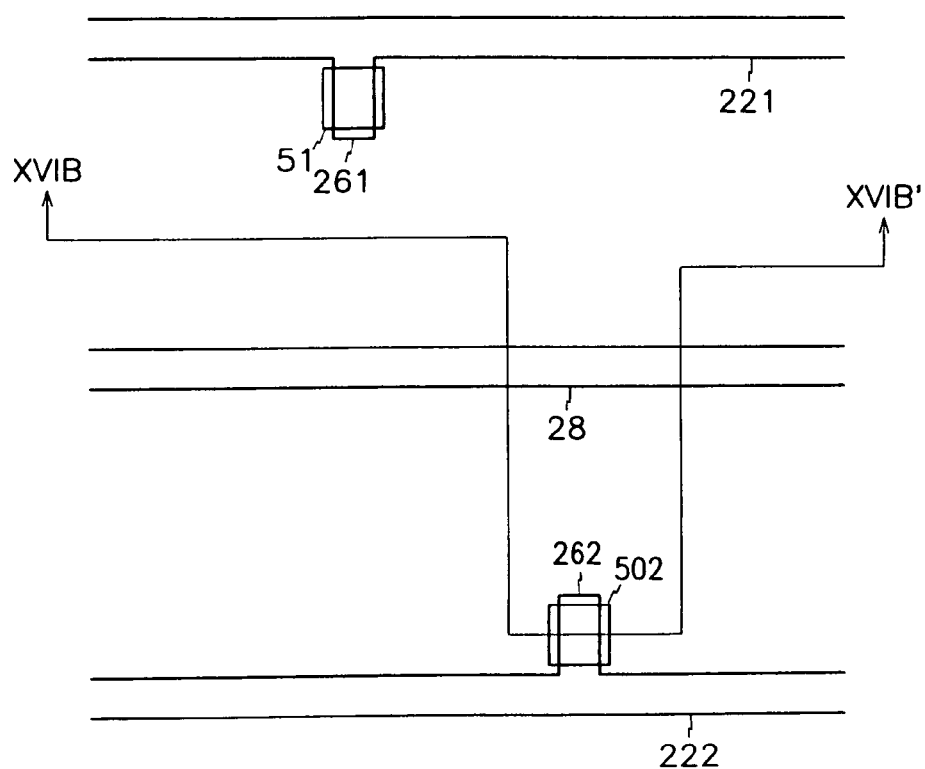
FIG. 16A is a layout view showing a step following the step shown in FIG. 15A.
Figure 16B:
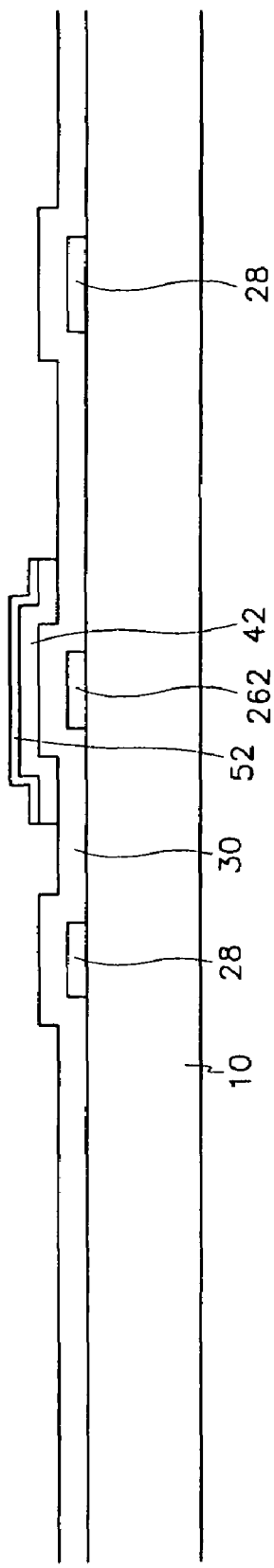
FIG. 16B is a sectional view taken along the line XVIB–XVIB' of FIG. 16A.
Figure 17A:
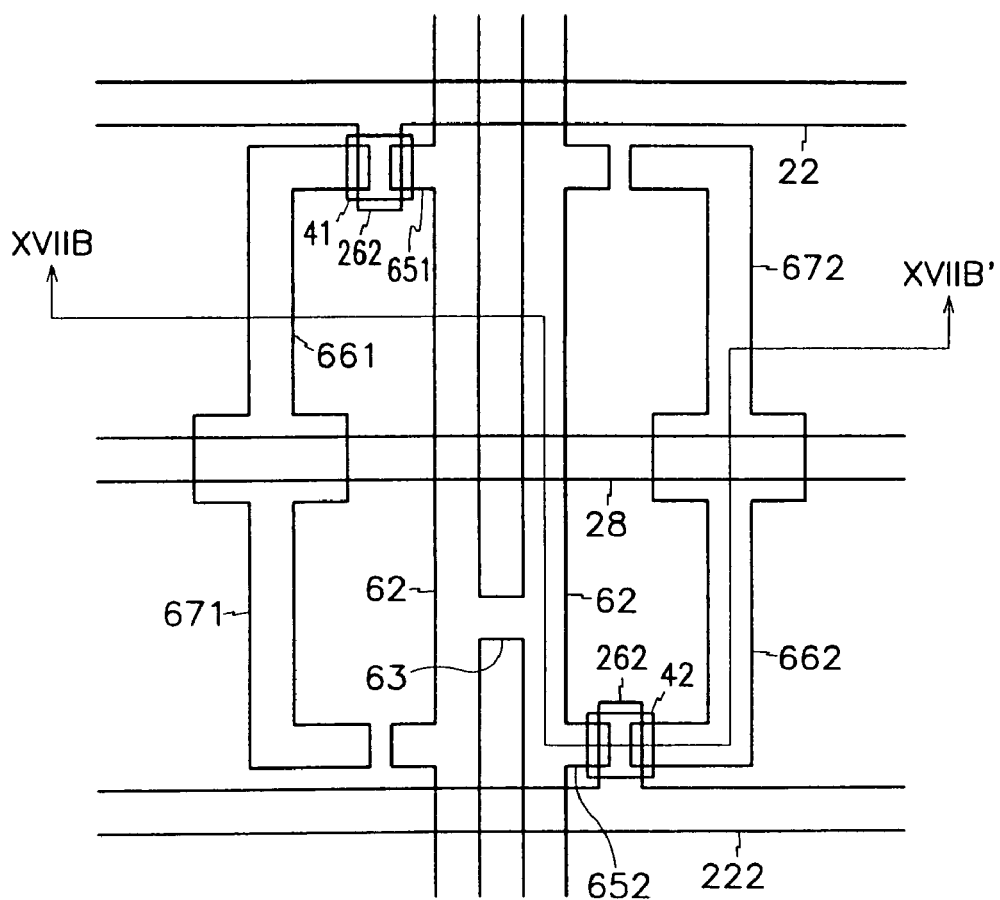
FIG. 17A is a layout view showing a step following the step shown in FIG. 16A.
Figure 17B:
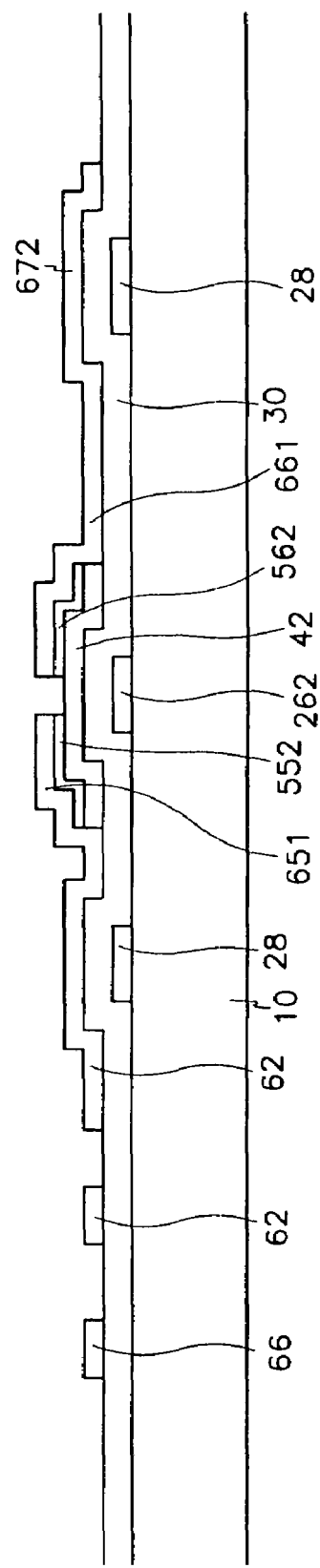
FIG. 17B is a sectional view taken along the line XVIIB–XVIIB' of FIG. 17A.
Figure 18:
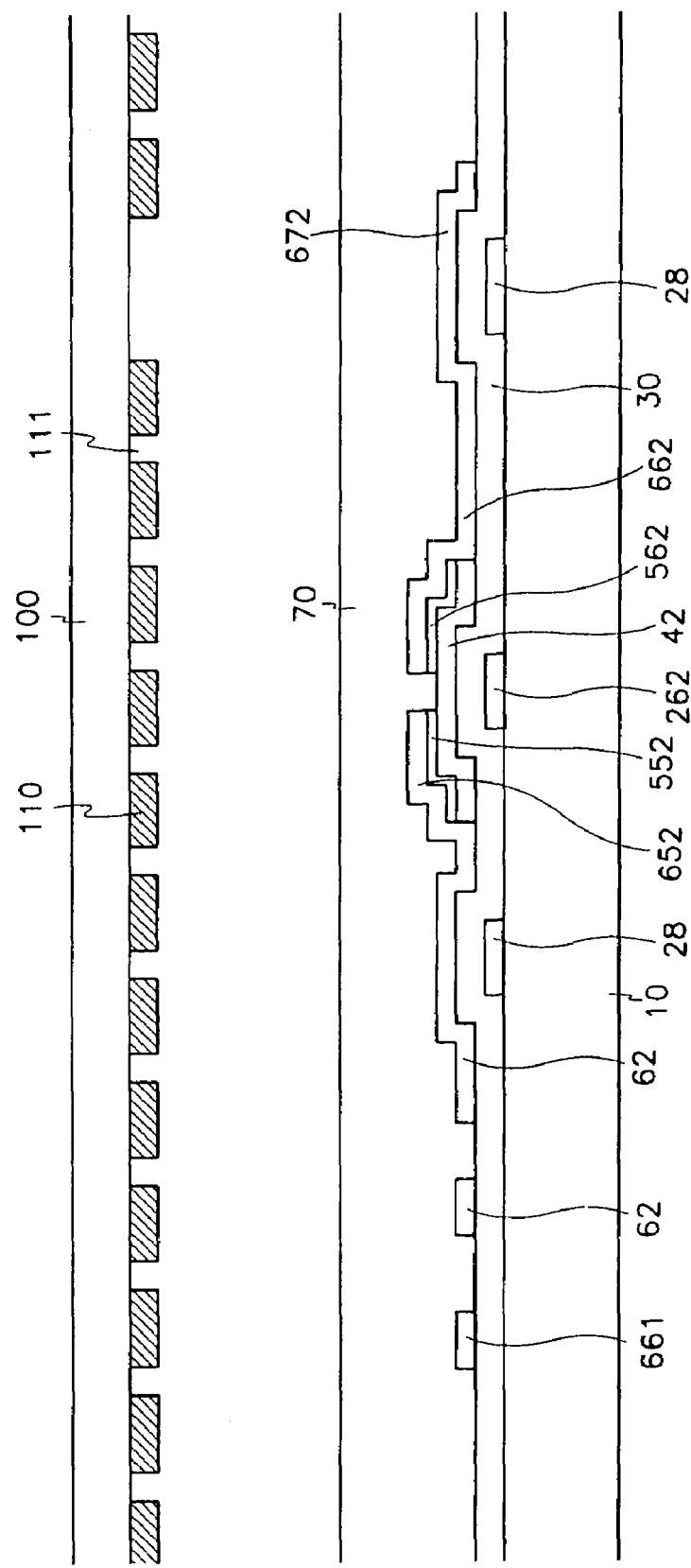
FIG. 18 is a layout view showing a step following the step shown in FIG. 17A.
Figure 19A:
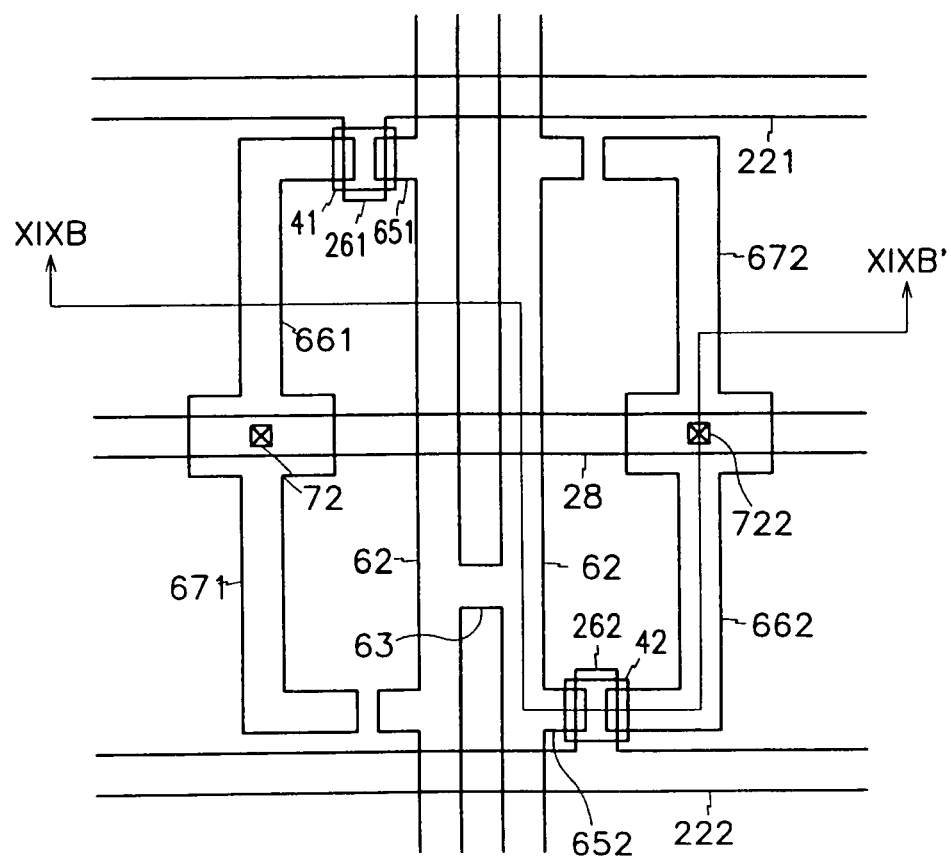
FIG. 19A is a layout view showing a step following the step shown in FIG. 18.
Figure 19B:
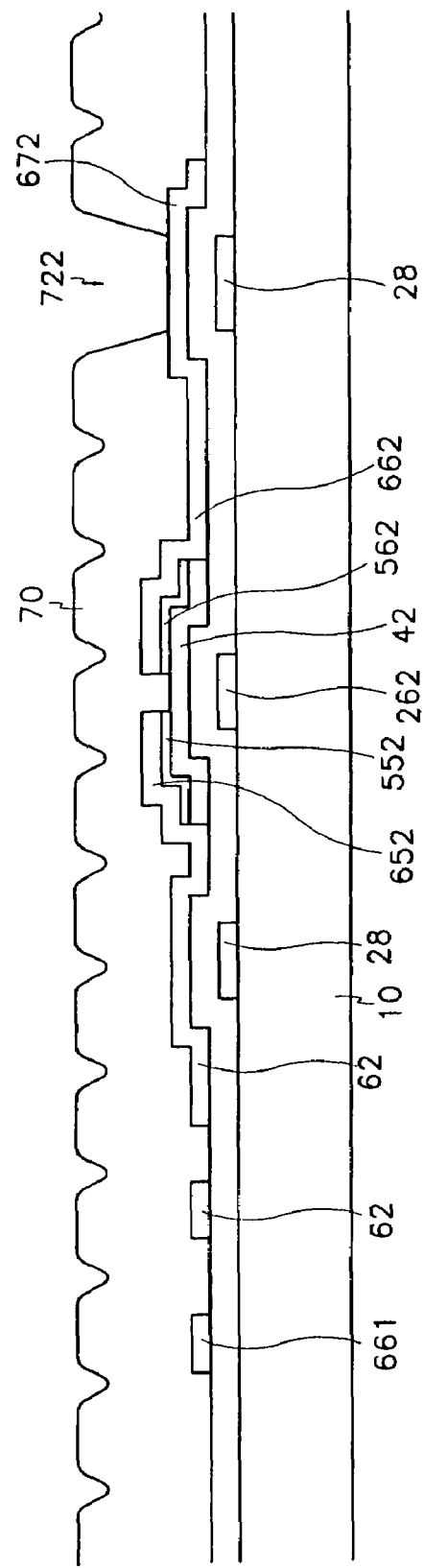
FIG. 19B is a sectional view taken along the line XIXB–XIXB' of FIG. 19B.

As shown in FIGS. 13 and 14, the TFT array panel of this embodiment has almost the same structure as that of the third embodiment. The differences are first and second subsidiary members 671 and 672. The shapes of the first and the second subsidiary wires 672 is obtained by inverting first source and drain electrodes 651 and 661 and second source and drain electrodes 652 and 662 with respect to a line therebetween. Accordingly, a mask for forming a passivation layer 70 used in an area having a first pixel electrode 821 can be used for the other area having a second pixel electrode 822 by inverting the mask, as shown in FIGS. 13–19B.

In the third and the fourth embodiments of the present invention, the uniform unevenness between two areas provided with the first and the second pixel electrodes 821 and 822, respectively, is obtained in a manner that a mask for forming the passivation layer, the gate wire, the data wire, the semiconductor islands or the pixel electrodes which is used in one area, is also used in the other area by either 180-degree rotation or inversion. However, there are several ways for aligning the mask depending on the shapes of the thin film transistor. It is preferable that the thin film transistor is symmetrical between adjacent two areas.

Meanwhile, the symmetrical structure of the subpixels is applied to a semi-transmission type LCD as shown in FIGS. 1 and 2. In this case, it is preferable that the area of the transmission portions T ranges 20–30% among the total area.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A thin film transistor array panel comprising:
   a storage line formed over a substrate;
   a gate wire formed over the substrate and extending parallel to the storage line, the gate wire comprising a first gate line including a first gate electrode and a second gate line including a second gate electrode;
   a data wire formed over and extending perpendicular to the gate wire, the data wire comprising:

a first data line including a first source electrode and a first drain electrode disposed opposite the first source electrode with respect to the first gate electrode;

a second data line including a second source electrode and a second drain electrode disposed opposite the second source electrode with respect to the second gate electrode; and a data connector that connects the first data line to the second data line;

a first pixel electrode connected to the first drain electrode; and a second pixel electrode connected to the second drain electrode.

2. The thin film transistor array panel of claim 1, wherein a shape formed by the first and second gate electrodes, the first and second source electrodes and the first and second drain electrodes has rotational symmetry.

3. The thin film transistor array panel of claim 1, further comprising:

a first semiconductor island formed over the first gate electrode; and a second semiconductor island formed over the second gate electrode.

4. The thin film transistor array panel of claim 3, further comprising:

a first ohmic contact layer formed over the first semiconductor island; and a second ohmic contact layer formed over the second semiconductor island, each of the first and second ohmic contact layers comprising a first portion and a second portion disposed opposite the first portion with respect to a corresponding one of the first and second semiconductor islands.

5. The thin film transistor array panel of claim 4, further comprising:

a passivation layer formed over the data wire and having an uneven surface, the first and second pixel electrodes being formed over the passivation layer.

6. The thin film transistor array panel of claim 1, further comprising:

a first subsidiary member extending from the first data wire; and a second subsidiary member extending from the second data wire.

* * * * *